US012798957B2

(12) United States Patent
Barzen et al.

(10) Patent No.: US 12,798,957 B2
(45) Date of Patent: Nov. 17, 2026

(54) MEMS DEVICE AND METHOD FOR MANUFACTURING A MEMS DEVICE

(71) Applicant: Infineon Technologies AG, Neubiberg (DE)

(72) Inventors: Stefan Barzen, Munich (DE); Alexander Frey, Lappersdorf (DE); Matthias Friedrich Herrmann, Munich (DE); Jun Cheng Ooi, Gelugor (MY); Hans-Jörg Timme, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 465 days.

(21) Appl. No.: 18/352,444

(22) Filed: Jul. 14, 2023

(65) Prior Publication Data

US 2024/0017986 A1 Jan. 18, 2024

(30) Foreign Application Priority Data

Jul. 15, 2022 (EP) .................................... 22185233

(51) Int. Cl.
*B81B 3/00* (2006.01)
*B81C 1/00* (2006.01)

(52) U.S. Cl.
CPC .............. *B81B 3/007* (2013.01); *B81B 3/001* (2013.01); *B81C 1/00658* (2013.01); *B81B 2201/0257* (2013.01); *B81B 2203/0127* (2013.01); *B81B 2203/04* (2013.01); *B81C 2201/0133* (2013.01); *B81C 2201/0178* (2013.01)

(58) Field of Classification Search
CPC . B81B 3/007; B81B 3/001; B81B 2201/0257; B81B 2203/0127; B81B 2203/04; B81B 7/02; B81B 3/0067; B81C 2201/034; B81C 1/00658; B81C 2201/0133; B81C 2201/0178; H04R 19/005; H04R 2201/003; H04R 19/04; H04R 31/006; H04R 2231/001
USPC .......................................................... 257/415
See application file for complete search history.

(56) References Cited

U.S. PATENT DOCUMENTS

| | | | | |
|---|---|---|---|---|
| 2015/0001647 | A1 | 1/2015 | Dehe et al. | |
| 2015/0245118 | A1 | 8/2015 | Dehe | |
| 2015/0358735 | A1 | 12/2015 | Klein et al. | |
| 2020/0239302 | A1 | 7/2020 | Strasser et al. | |
| 2020/0290864 | A1 * | 9/2020 | Fueldner | H04R 31/003 |
| 2021/0044905 | A1 * | 2/2021 | Walther | H04R 19/04 |

* cited by examiner

*Primary Examiner* — Moazzam Hossain
(74) *Attorney, Agent, or Firm* — Slater Matsil, LLP

(57) ABSTRACT

A MEMS device comprises a first membrane structure having a reinforcement region formed from one piece of the first membrane structure, wherein the reinforcement region has a larger layer thickness than an adjoining region of the first membrane structure. The MEMS device includes an electrode structure, wherein the electrode structure is vertically spaced apart from the first membrane structure.

20 Claims, 6 Drawing Sheets

MEMS DEVICE AND METHOD FOR MANUFACTURING A MEMS DEVICE

This application claims the benefit of European Patent Application No. 22185233, filed on Jul. 15, 2022, which application is hereby incorporated herein by reference.

TECHNICAL FIELD

The present disclosure relates to a MEMS device and to a method for fabricating such a MEMS device.

BACKGROUND

There is a need for sensitive and robust sensors.

SUMMARY

According to an embodiment, a MEMS device comprises a first membrane structure, wherein the first membrane structure comprise a reinforcement region, wherein the reinforcement region has a larger thickness than an adjoining region of the first membrane structure. The MEMS device comprises an electrode structure, wherein the electrode structure is vertically spaced apart from the first membrane structure. A method for manufacturing such a MEMS device comprises manufacturing the reinforcement region of the first membrane structure using a local-Oxidation-of-Silicon, (LOCOS,) and arranging the electrode structure vertically spaced apart from the membrane structure.

BRIEF DESCRIPTION OF THE DRAWINGS

Embodiments in accordance with the present disclosure are described herein while making reference to the accompanying drawings in which.

Figure 1:
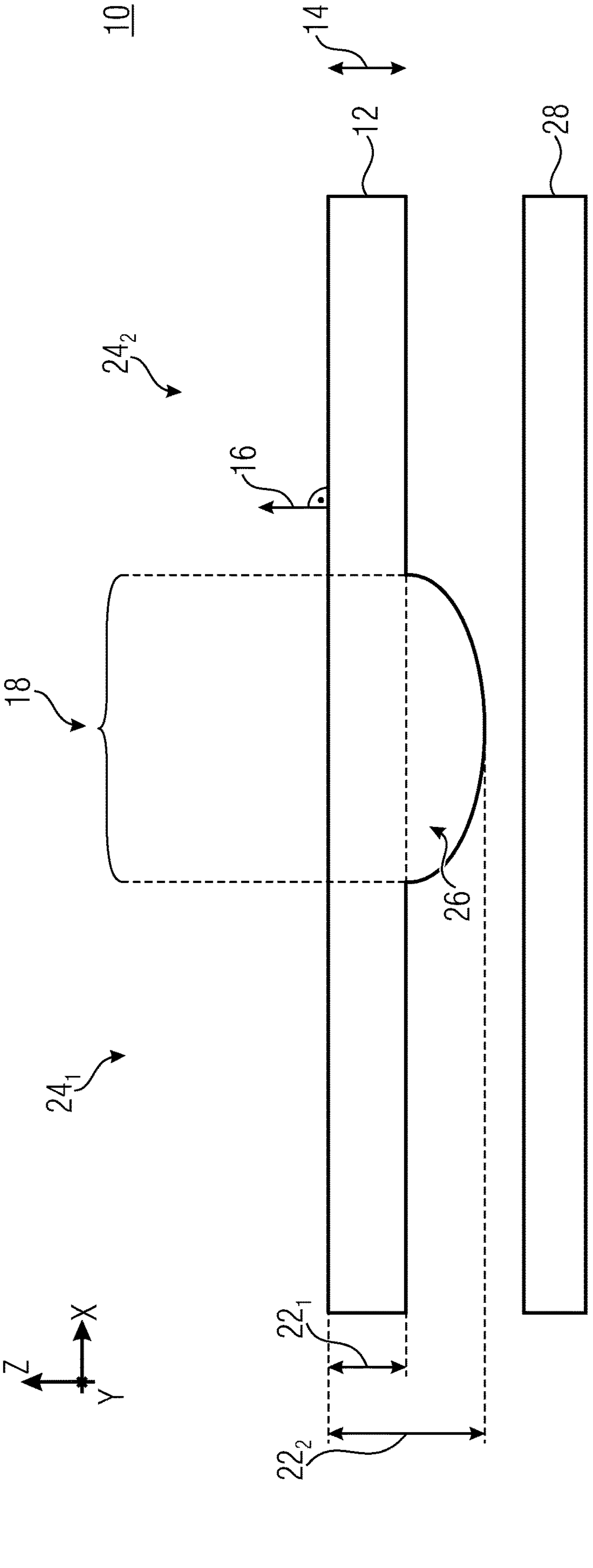
FIG. 1 is a schematic side view of a single-membrane MEMS device according to an embodiment.

Equal or equivalent elements or elements with equal or equivalent functionality are denoted in the following description by equal or equivalent reference numerals even if occurring in different figures.

DETAILED DESCRIPTION OF ILLUSTRATIVE EMBODIMENTS

In the following description, a plurality of details is set forth to provide a more thorough explanation of embodiments of the present disclosure. However, it will be apparent to those skilled in the art that embodiments of the present disclosure may be practiced without these specific details. In other instances, well known structures and devices are shown in block diagram form rather than in detail in order to avoid obscuring embodiments of the present disclosure. In addition, features of the different embodiments described hereinafter may be combined with each other, unless specifically noted otherwise.

Embodiments described herein are related to microelectromechanical system (MEMS) devices. A MEMS device may comprise one or more semiconductor materials, for example an at least partially doped or undoped semiconductor material such as silicon, gallium arsenide or the like and/or combinations thereof. Materials derived therefrom such as silicon nitride (SiN, $Si_3N_4$, respectively), silicon oxide (SiOx, $SiO_2$, respectively) or the like may be arranged alternatively or in addition. Alternatively, or in addition, other materials such as a metal material, e.g., aluminum, copper, gold, silver, platinum or the like may be part of a MEMS structure.

Embodiments described herein may relate to a membrane structure. Such a membrane structure may be a beam-like membrane or a more circular structure, e.g., a round or circular membrane, a quadratic membrane structure or a rectangular membrane structure. A beam-like membrane may differ from a conventional (e.g., circular) membrane with respect to its boundary conditions. For example, a circular membrane may be clamped at its edge or perimeter, whereas a beam-like membrane may comprise some free edges. A membrane structure described herein may be formed, for example, similar to a membrane structure being used in the MEMS microphones or MEMS loudspeakers. Possibly a membrane structure described herein is deflectable in a deflectable region or portion thereof. However, an ability to deflect is not necessary in connection with embodiments described herein. A membrane may also be or remain undeflected while making benefit from the teachings disclosed herein.

Some of the embodiments described herein are explained in connection with MEMS devices that may implement at least a part of a MEMS microphone. However, embodiments described herein are not limited to MEMS microphones. The described principles may be applied, without limitations, to other MEMS sensors and/or actuators. For example, a MEMS sensor may be implemented as a pressure sensor or other type of sensor. An actuator may, for example, provide at least for a part of a loudspeaker, a pump or the like, comprising a membrane. That is, one aspect of embodiments described herein relate to sound transducers such as microphones or loudspeakers while other types of sensors and/or actuators using a membrane for operation may also benefit from the described principles. Embodiments of the present disclosure in particular relate to a silicon microphone with a membrane to enhance robustness of the membrane by creating the membrane with locally different thicknesses.

FIG. 1 is a schematic side view of a MEMS device 10 according to an embodiment. The MEMS device 10 comprises a membrane structure 12 being configured for deflecting along a direction 14 which may be, at least within a tolerance range, be in parallel with a surface normal 16 of the membrane structure 12, the surface normal 16 being perpendicular to one or both lateral extension directions. For example, the membrane structure 12 may be arranged so as to extend along lateral directions x and y while a thickness of the membrane structure may be arranged perpendicular hereto along a z-direction of an example Cartesian coordinate system. The direction 14 along with the membrane structure 12 may be flagged may, thus, be perpendicular to the z-direction as is the surface normal 16.

The membrane structure 12 may comprise a reinforcement region 18 which may be understood as a part of the extension of the membrane structure 12 along the lateral directions x and/or y. In the reinforcement region 18 the membrane structure 12 may comprise a larger layer thickness $\mathbf{22_2}$ when compared to an adjoining region $\mathbf{24_1}$ and/or $\mathbf{24_2}$ of the membrane structure 12 having a layer thickness $\mathbf{22_1}$.

An increase of the layer thickness $\mathbf{22_2}$ when compared to the layer thickness $\mathbf{22_1}$ may be larger or even significantly larger when compared to manufacturing tolerances that might provide for variances in the range of e.g., 1%, 2% or 5%. For example, the layer thickness $\mathbf{22_1}$ may be in a range of at least 10 nm and at most 10 μm, at least 20 nm and at most 5 μm or at least 100 nm and at most 1 μm, for example, around 315 nm. Compared hereto, the layer thickness $\mathbf{22_2}$ may be increased by at least 20%, at least 50%, at least 80% or even more. For example, the layer thickness of 315 nm may be increased to at least 400 nm and at most 2 μm, at least 500 nm and at most 1.5 μm or at least 600 nm and at most 1 μm, e.g., 760 nm.

The layer thickness $\mathbf{22_2}$ may relate to a maximum value of the layer thickness inside the reinforcement region 18, e.g., in case a continuous variation of the layer thickness if increased along the x and/or y-direction. A shape of the membrane with regard to the increase may also be discontinuous, e.g., formed as a kind of square or brick wall or the like.

The reinforcement region 18 may be formed by material being same or different from a material of the membrane structure 12. For example, it may be formed from one piece with the membrane structure 12, i.e., it may be integrally formed with the membrane structure 12. However, other ways of mechanically connecting additional reinforcing material 26 in the of the reinforcement region 18 to material of the membrane structure 12 during deposition of, e.g., the membrane structure onto the reinforcing material 26 or the reinforcing material 26 onto the membrane structure may be implemented, e.g., based on the used deposition process.

For example, arranging the additional material 26 at the membrane structure 12 or vice versa may be obtained by arranging or depositing the additional material 26 to increase the layer thickness $\mathbf{22_2}$ in the reinforcement region when compared to the adjoining regions 24. The additional material 26 may be arranged, e.g., by using an additional process or process step to attach the material 26 at the membrane structure 12, such an additional step may be executed prior or after providing the membrane. Alternatively, or in addition, material may be locally removed from the membrane structure 12, e.g., in the adjoining regions $\mathbf{24_1}$ and/or $\mathbf{24_2}$ such that the material 26 may form, at least in parts, a remains of such a process. Alternatively, or in addition, the membrane structure 12 may be formed so as to comprise the material 26 and the reinforcement region, e.g., by use of a deposition process or the like that deposits more material in the reinforcement region when compared to the adjoining regions $\mathbf{24_1}$ and/or $\mathbf{24_2}$.

The MEMS device 10 comprises an electrode structure 28 that is vertically spaced apart from the membrane structure 12. As a spacing vertically apart from the membrane structure 12 it may be understood to have a distance along the direction of deflection 14 between the membrane structure 12 and the electrode structure 28. The membrane structure 12 and the electrode structure 28 may overlap, at least in part, when being projected into a plane parallel to the x/y-direction. The electrode structure 28 may be understood as a backplate structure, e.g., when the MEMS device 10 forms a part of a MEMS microphone. The electrode structure 28 may be of a same or a different size along the x, y and/or z-direction when compared to the membrane structure 12.

The membrane structure 12 may be formed at least locally electrically conductive to allow application of an electrical potential between the membrane structure 12 and the electrode structure 28 that may provide for a basis for operating the MEMS device 10 as a sensor and/or an actuator.

The reinforcement region 18 may allow to combine different requirements being imposed on a membrane structure by using a single configuration. While using a comparatively thin membrane in the adjoining region $\mathbf{24_1}$ and/or $\mathbf{24_2}$, a high compliance may be achieved that may allow for small chip areas and/or small extensions of the membrane in the x/y-direction. At a same time, the reinforcement region may allow for a high compliance by providing a high robustness of the membrane structure. According to an embodiment, the reinforcement region is arranged at a location or position of the membrane structure 12 which is subjected to a locally increased mechanical stress during an operation condition of the MEMS device 10, during an overload condition of the MEMS device and/or a misuse condition of the MEMS device. For example, where it is expected or possible to face high mechanical loads at the membrane structure 12, the membrane may locally be reinforced to avoid damages.

Such locations may be arranged at areas where the membrane is configured or expected to abut other structures or to face high stresses due to bending and/or stretching.

The membrane structure 12 may comprise a single or a multitude of reinforcement areas 18. Implementing a multitude of reinforcement regions 18 at the membrane structure 12 may allow for using a same layer thickness $\mathbf{22_2}$ for some or all of the reinforcement regions but may also to deviate with regard to the implemented layer thickness along different reinforcement regions.

Although being illustrated as facing the electrode structure 28, the reinforcement region may also be arranged at a side of the membrane structure 12 facing away from the electrode structure 28.

Figure 2A:
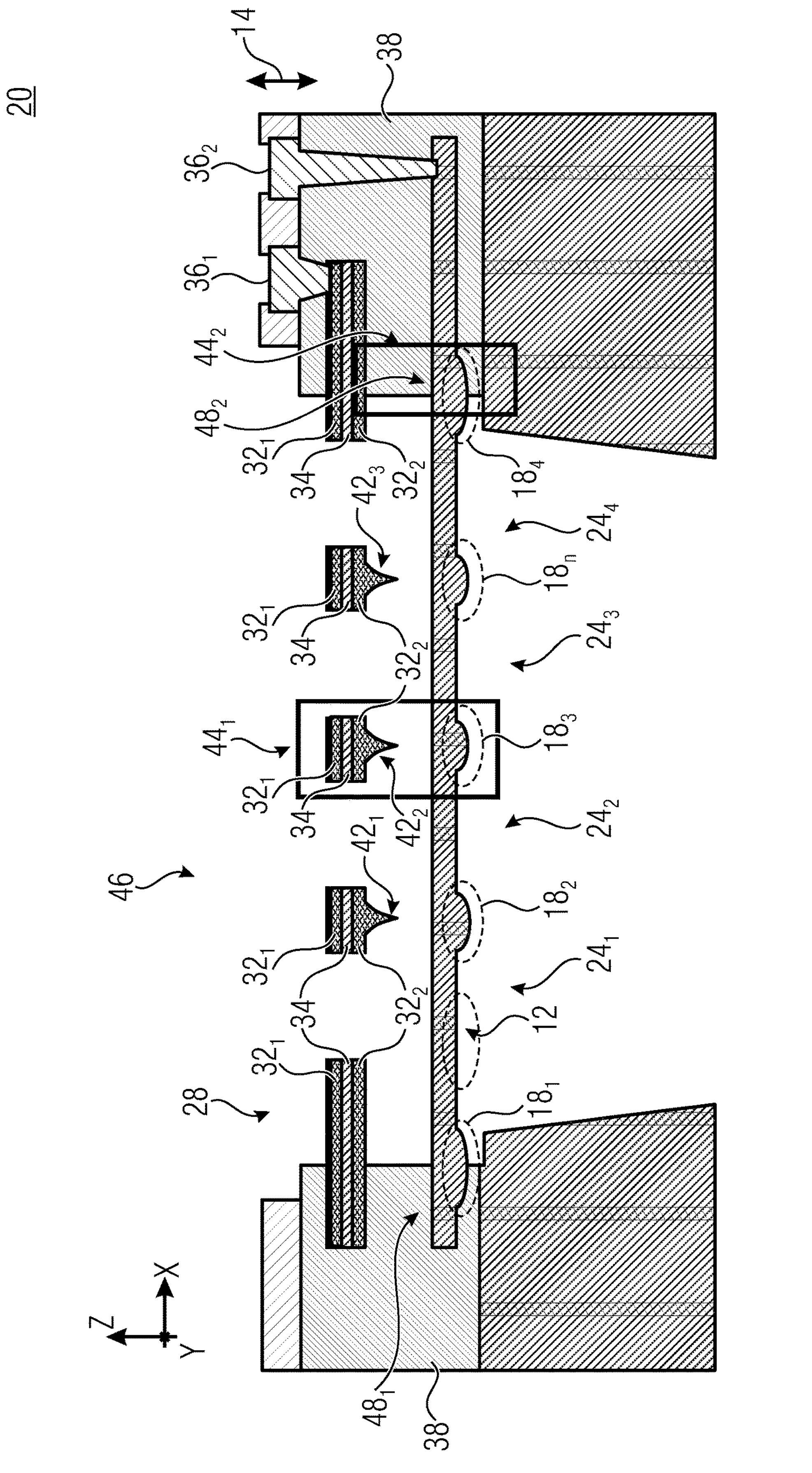
FIG. 2*a* shows a schematic side view of a MEMS device according to an embodiment that comprises a layered electrode structure.

FIG. 2*a* shows a schematic side view of a MEMS device 20 according to an embodiment. The MEMS device 20 may comprise a layered electrode structure 28 that may have one or more insulating layers $\mathbf{32_1}$ and/or $\mathbf{32_2}$ and/or at least one conductive layer 34 that may be contacted by an electrical contact $\mathbf{36_1}$ to apply and/or receive an electrical potential.

The membrane structure 12 may comprise one or a plurality of n reinforcement regions $\mathbf{18_1}$ to $\mathbf{18_n}$. Parameter n may be a value of at least 1, at least 2, at least 5, at least 10, at least 100 or even moo or more. For example, reinforcement region $\mathbf{18_1}$ and/or $\mathbf{18_4}$ may be arranged in an area at which the membrane structure 12 is clamped or configured to abut a supporting structure 38, e.g., a substrate or the like. The membrane structure 12 may be electrically connected via an electrical contact $\mathbf{36_2}$ which may allow to obtain and/or sense a potential difference between electrical contacts $\mathbf{36_1}$ and $\mathbf{36_2}$.

Reinforcement regions $\mathbf{18_2}$, $\mathbf{18_3}$ and/or $\mathbf{18_n}$ may be arranged at a location of an elevation or bump $\mathbf{42_1}$ to $\mathbf{42_3}$ or other structures that are adapted to provide a mechanical contact or an abutting region for the membrane structure 12 so as to reinforce the mechanical structure of the membrane structure 12 at this location. That is, when projecting elevation or bumps $\mathbf{42_1}$ to $\mathbf{42_3}$, they may overlap, partially or completely, with reinforcement regions $\mathbf{18_2}$, $\mathbf{18_3}$, $\mathbf{18_n}$, respectively. Although not necessarily implemented in such a way, at least one of elevation or bumps 42$_1$ to 42$_3$ may serve as an anti-stiction bump.

Clamping or abutting regions at the reinforcement regions 18$_1$ and 18$_4$ are examples for critical locations as are the reinforcement regions 18$_2$, 18$_3$ and 18$_n$ that are expected to be subjected to a locally increased mechanical stress. Such a locally increased mechanical stress may occur during an operation condition as well as an overload condition or a misuse condition, e.g., dropping the device or mechanically overloading the device. The MEMS device 20 may show a comparatively thick membrane at such critical locations to increase robustness at those regions and may show a comparatively thin membrane in other regions to increase sensitivity or maintain a high sensitivity. This may incorporate to skip a corrugation. Adjoining regions 24$_1$ to 24$_j$ may be arranged adjacent to the reinforcement regions. However, the adjoining regions 24$_1$ to 24$_j$ may be connected to one another at least partly or may form a common adjacent region, e.g., in a case where one or more of the reinforcement regions 18$_1$ to 18$_m$ is formed as an island structure or the like.

Figure 2B:
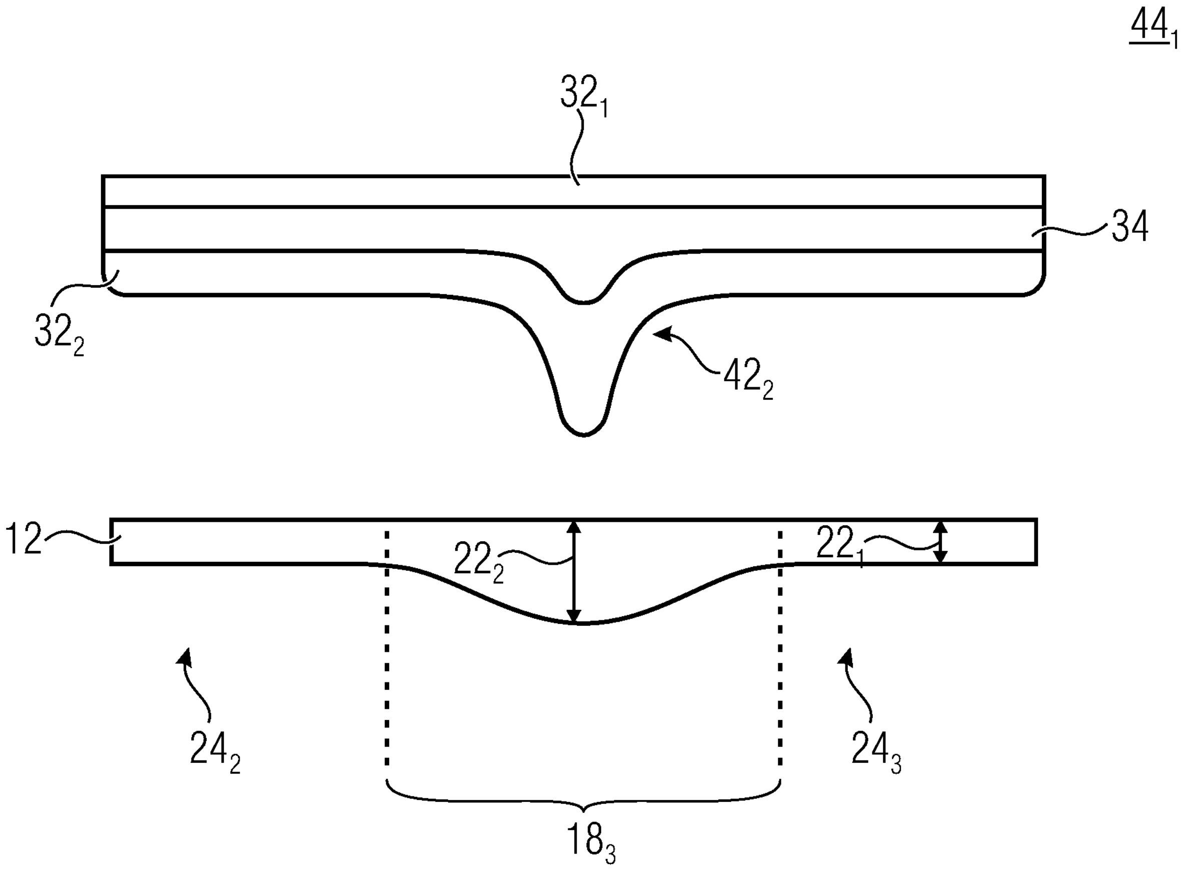
FIG. 2*b* shows a schematic side view of an inner section of a realization of MEMS device of FIG. 2*a;*

FIG. 2*b* shows a schematic side view of an implementation of MEMS device 20, in particular, a section 44$_1$ thereof. FIG. 2*b* shows insulating layers 32$_1$ and 32$_2$ sandwiching conductive layer 34 and anti-stiction bump 42$_2$. As may be seen in FIG. 2*b*, the reinforcement region 18$_3$ of the membrane structure 12 may be arranged in a position aligned with respect to a bump or elevation arranged at the electrode structure 28. Such a bump or elevation 42$_2$, e.g., an anti-stiction bump, may in addition or as an alternative be arranged at the membrane structure 12. For example, at a side opposing such a bump or elevation, the reinforcing material may be arranged so as to form the reinforcement region. This does not prevent to have the additional material of the reinforcement region at a same side as the bump or elevation. In the example shown in FIG. 2*b*, the bump or elevation, i.e., the anti-stiction bump 42$_2$, may be oriented towards the membrane structure 12. As is also illustrated in FIG. 2*b*, the reinforcement region 18$_3$ may be arranged to comprise a gradual or stepless transition of the layer thickness 22 to the adjoining region 24$_2$ and/or 24$_3$. According to other implementations the transition may comprise a step, i.e., a steep or transient transition.

Figure 2C:
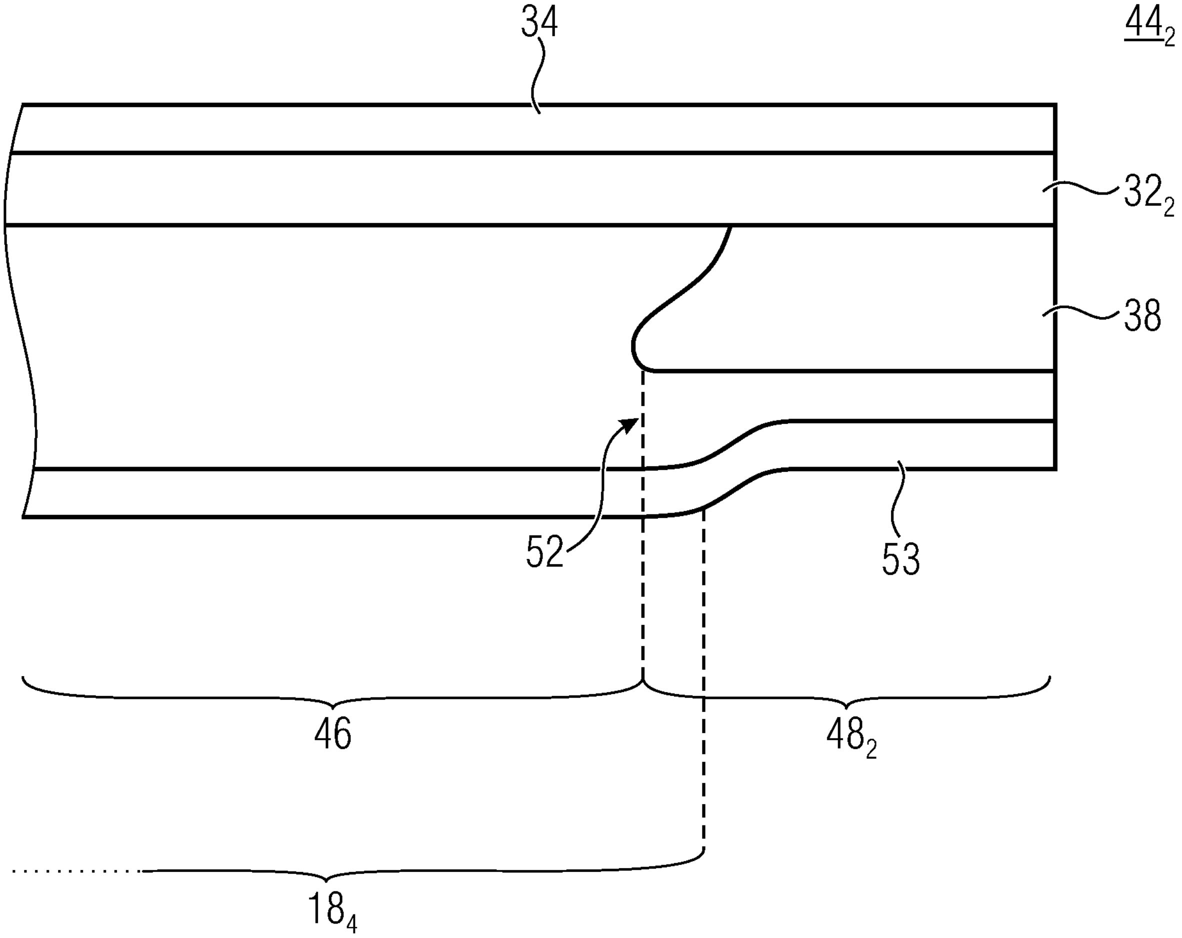
FIG. 2*c* shows a schematic side view of an outer section of a realization of MEMS device of FIG. 2*a;*

When referring back again to FIG. 2*a*, a section 44$_2$ thereof is shown by way of a schematic side view of a realization of such a structure in FIG. 2*c*. while the section 44$_1$ represents at least a part of a deflectable region 46 of the membrane structure 12, section 44$_2$ may be considered as a clamped border region 48 that adjoins the deflectable region 46. Between the deflectable region 46 and clamped regions 48$_1$ and 48$_2$ there may be representable a borderline 52. The clamped border region 48 may adjoin the deflectable region 46 along the borderline 52 of the deflectable region 46. The reinforcement region 18$_4$ is arranged at the borderline, i.e., to overlap the borderline that indicates a region of increased mechanical stress. An optional layer 53 shown in FIG. 2*c* the bright layer in 2*c* may be at least a part of a sacrificial layer, e.g., comprising an oxide. The layer 53 may be arranged at a position possibly below the membrane 12. In the region overlapping the moveable membrane 12 the layer 53 may be etched away. Alternatively or in addition, in a region where the membrane 12 is affixed, the layer 53 may remain.

Figure 3:
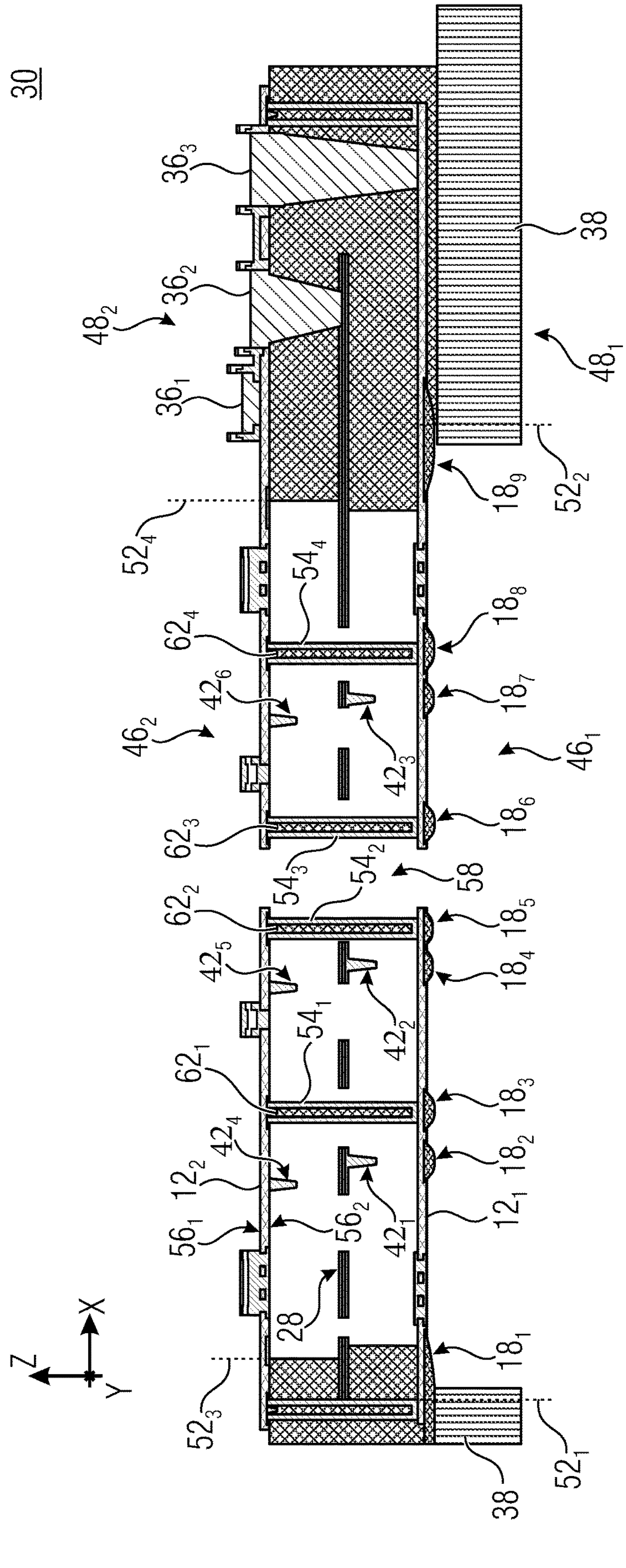
FIG. 3 shows a schematic side view of an example MEMS device according to an embodiment having two membrane structures sandwiching an electrode structure.

FIG. 3 shows a schematic side view of an example MEMS device 30 according to an embodiment. While the MEMS device 20 may realize, for example, a single backplate sound transducer with a single membrane structure, MEMS device 30 may implement a sealed dual membrane, SDM, device. Such a device may comprise a membrane structure 12$_1$ and an opposing membrane structure 12$_2$ that may be spaced apart by mechanical connection elements 54$_1$ to 54$_4$, e.g., formed as pillar structures, and having the electrode structure 28 sandwiched therebetween. For example, the membrane structure 12$_1$ may be adapted to abut bump structures 42$_1$, 42$_2$ and/or 42$_3$ which may be addressed by implementing reinforcement regions 18$_2$, 18$_4$, 18$_7$, respectively. Alternatively, or in addition, bump structures 42$_4$, 42$_5$ and/or 42$_6$ may be adapted to abut the electrode structure 28. Although not shown the membrane structure 12$_2$ may comprise reinforcement regions at corresponding locations on a side 56$_1$ and/or a side 56$_2$ thereof. Alternatively, or in addition, reinforcement regions 18$_3$, 18$_5$, 18$_6$ and/or 18$_8$ may be arranged at membrane structure 12$_1$ and/or 12$_2$ at locations at which mechanical connection elements 54$_1$, 54$_2$, 54$_3$ and/or 54$_4$ are arranged on a same or opposing side of the respective electrode structure 12$_1$ and/or 12$_2$. Alternatively, or in addition, reinforcement regions 18$_1$ and 18$_9$ may be implemented together or independent from one another in a region of borderlines 52$_1$ and/or 52$_2$.

Membrane structures 12$_1$ and 12$_2$ may be electrically connected to contacts 36$_1$ and/or 36$_3$. In a similar way, the electrode structure 28 may be electrically connected via electrical contact 36$_2$. Optionally, the MEMS device 30 may comprise one or more ventilation holes 58 to facilitate a movement of the membrane structures 12$_1$ and/or 12$_2$. According to an embodiment, a MEMS device such as MEMS device 30 may comprise, beside the first membrane structure, a second membrane structure wherein the electrode structure 28 may be arranged between the first and the second membrane structures 12$_1$ and 12$_2$. The membrane structures 12$_1$ and 12$_2$ may each comprise a deflectable portion or deflectable region 46$_1$, 46$_2$, respectively. The deflectable portions 46$_1$ and 46$_2$ may be mechanically connected or coupled by means of at least one mechanical connection element 54 to one another while being mechanically decoupled from the electrode structure 28. The deflectable region 46$_2$ and a clamped region 48$_2$ of the membrane structure 12$_2$ may be arranged so as to adjoin one another along borderlines 52$_3$ and/or 52$_4$.

Although not shown in FIG. 3, the membrane structure 12$_2$ may comprise one or more reinforcement regions also being formed as a single piece of the membrane structure 12$_2$. Such a reinforcement region may comprise a larger layer thickness than an adjoining region as was described in connection with membrane structure 12 in FIG. 1. According to an embodiment, the reinforcement region of membrane structure 12$_2$ may comprise a gradual or stepless transition of the layer thickness to the adjoining region. As was described in connection with membrane structure 12$_1$, the position of the membrane structure 12$_2$ is subjected to locally increased mechanical stress during an operation condition, an overload condition and/or a misuse condition of the MEMS device.

According to another aspect of embodiments described herein the membrane structure 12$_1$ and/or 12$_2$ may comprise a reinforcement structure or local stiffening 62 that may be arranged at a coupling position at which the membrane structure is connected to at least one mechanical connection element 54 and/or in a region where the membrane structure 12$_2$ is clamped, e.g., at the borderline 52$_3$. The reinforcement structure 621, 622, 623 and/or 624 may comprise, for example, a material that has a higher stiffness when compared to a material of the membrane structure itself. For example, a material such as silicon nitride or the like may be used to reinforce a silicon-based membrane structure. Such a material may allow to use a material that is used for insulating one or more regions.

Respective reinforcement regions being not shown in FIG. 3 may, as was described in connection with MEMS device 10 and/or 20, be arranged in a position aligned with respect to a bump or elevation arranged at the electrode structure and/or at the membrane structure $\mathbf{12}_2$. Such a bump or elevation, e.g., an anti-stiction bump, on the electrode structure 28 may be orientated towards the membrane structure $\mathbf{12}_2$.

Reinforcement regions $\mathbf{18}_1$ and/or $\mathbf{18}_9$ that may be adapted to abut supporting structure 38 may be formed according to a hill-like structure but may, as an alternative, be formed like a donut-like structure, e.g., having a reduced thickness or being even absent in a center region or inner section, e.g., so as to host therein an edge of the supporting structure 38 abutting the reinforcement region.

A reinforcement region $\mathbf{18}_1$ to $\mathbf{18}_9$ may have a larger extension along the x-direction and/or y-direction when compared to the structure forming the source of the stress to be compensated for. For example, an elevation or bump such as bump $\mathbf{44}_1$, $\mathbf{44}_2$ and $\mathbf{44}_3$ may provide for a comparatively small surface abutting the membrane structure $\mathbf{12}_1$. This may allow an extension or diameter of reinforcement regions $\mathbf{18}_2$, $\mathbf{18}_4$ and/or $\mathbf{18}_7$ of, e.g., 2 μm, 3 μm, 4 μm or other suitable values to be sufficient, e.g., applying a factor of 1, 2, 3 or more to the extension of the source of stress.

An extension of coupling structures 62 being, for example, around 2 μm along the x-direction may be compensated by use of a reinforcement region $\mathbf{18}_3$, $\mathbf{18}_5$ and/or $\mathbf{18}_8$ that has a same, two times, three times or four times or more of said dimension, e.g., in a range between 6 μm and 8 μm.

On the other hand, tolerances during manufacturing and/or operation may lead to uncertainties and/or larger areas of stress generation which may be addressed by implementing a large area of the respective reinforcement region. On the other hand, for example, an edge of a supporting structure 38 may be generated by use of an etching process such that an etched edge is inclined with regard to the z-direction. For example, this may come along with a tolerance of plus minus 20 μm and an extension of the reinforcement region $\mathbf{18}_9$ having, e.g., a double of said size or, e.g., 40 μm, may allow to compensate for such tolerances.

When considering the membrane structure $\mathbf{12}_1$ and/or $\mathbf{12}_2$ as a rectangular, round or oval structure, the reinforcement region $\mathbf{18}_1$ and $\mathbf{18}_9$ may also form a combined, segmented or uniform reinforcement region, e.g., having a circular or oval shape.

According to embodiments, the respective reinforcement region is at least of a same size when compared to the structure causing the stress to be compensated. According to other embodiments, the reinforcement region is larger, e.g., having a size of factor 2, 3, 4 or more.

One possible implementation to produce or obtain the varying layer thickness of the membrane structure 12 of a MEMS device 10 and/or 20 or the membrane structure $\mathbf{12}_1$ of MEMS device 30 is explained while making reference to a method being illustrated in FIGS. 4*a*-4*e*.

Figure 4A:
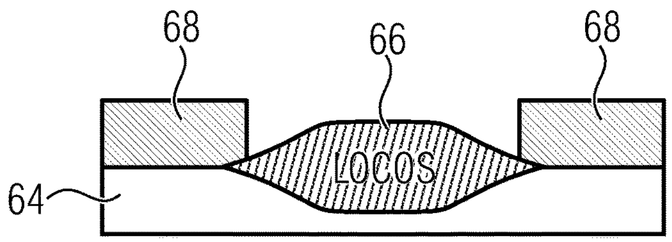
FIGS. 4*a*-4*e* show schematic side views of structures that may be obtained when performing a method in accordance with embodiments.

FIG. 4*a* shows a step of local oxidation, e.g., performing a local oxidation of a substrate 64 which may comprise, for example, a silicon material. Such a step may be considered as local oxidation of silicon (LOCOS) to obtain an oxide material 66 by at least partly oxidizing the substrate 64, e.g., using a mask 68.

Figure 4B:
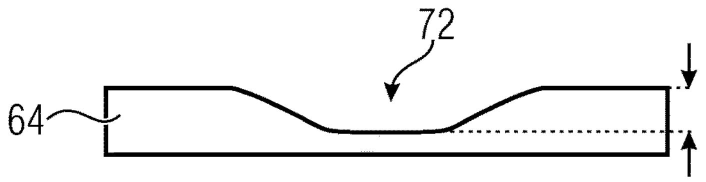

By removing the oxide material 66 as shown in FIG. 4*b*, a recess 72 may be obtained that may have a depth of, for example, at most or in a range of 1 μm, e.g., at least 10 nm, at least 100 nm or at least 300 nm, e.g., 500 nm or a different value below 1 μm or about 1 μm.

Figure 4C:
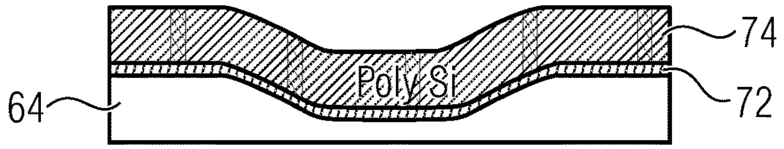

FIG. 4*c* shows an example of further processing the substrate 64 of FIG. 4*b* by performing a deposition of Tetraethylorthosilicate (TEOS—e.g., $C_8H_{20}O_4Si$) and a deposition of, e.g., an oxide layer 72, e.g., silicon-oxide $SiO_2$, followed by a deposition of a semiconductor layer 74 such as a silicon layer, in particular, a poly-silicon layer.

Figure 4D:
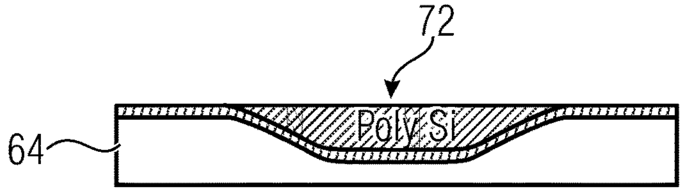

As shown in FIG. 4*d*, a planar surface may be obtained, for example, by using a chemical-mechanical polishing, CMP, process e.g., to remove at least a part of the layer 74 outside region 72 that may later form the reinforcement region 18. Using this planarized surface, a same material as layer 74 may be deposited again to increase the layer thickness homogeneously to obtain a varying thickness in the region 72 and outside thereof.

Figure 4E:
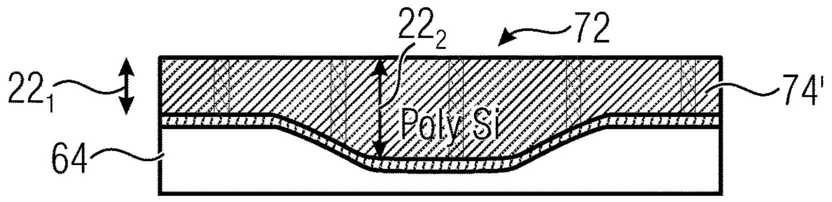

The step illustrated in FIG. 4*e* may be used to deposit again polysilicon and may allow to afterwards continue with standard processes to mount or use the obtained membrane structure. A process containing the steps as illustrated in FIGS. 4*a*-4*e* may be referred to as a locally thicker membrane (LTM) process. Such a process may be used for single backplate devices as well as sealed dual membrane devices. Although describing the membrane structure 12, $\mathbf{12}_1$ and/or $\mathbf{12}_2$ as being deflectable, such a feature is not mandatory. Also, undeflected structures may benefit from a reinforcement region. A locally reinforcement may provide for an improvement of robustness while providing for a high sensitivity. By using a locally thicker membrane, a stress being introduced in the reinforced structure may be distributed so as to allow for a uniform stress distribution or at least a more uniform stress distribution.

As shown by FIGS. 4*a*-4*e*, a method for manufacturing a MEMS device in accordance with embodiments described herein may comprise manufacturing the reinforcement region of the membrane structure using a LOCOS process. Alternatively, or even in combination, an etching process to obtain tapered edges of an etched recess at the reinforcement region may be used for manufacturing the reinforcement region. Such edges may be inclined with respect to a surface normal of a main surface of the membrane structure $\mathbf{12}_1$ and/or $\mathbf{12}_2$. For example, such an etching process may comprise a wet silicon oxide (SiO) etching with tapered edges, e.g. by damaging an implant and/or by using a doped oxide. Such an etching process may be implemented with low effort when compared to the LOCOS process, e.g., in a case where a structure such as membrane structure $\mathbf{12}_2$ of MEMS device 30 is hard or even unable to be processed with the LOCOS process. Further, not shown in FIGS. 4*a*-4*e*, a method may comprise arranging the electrode structure 28 vertically spaced apart from the membrane structure. As shown in FIGS. 4*a*-4*e*, a method may additionally comprise a step of oxide etching, FIG. 4*b*, a deposition of reinforcement material (TEOS, SiON/silicon oxide/silicon nitride, poly-Si), FIG. 4*c*, a planarization (CMP), FIG. 4*d* and/or a standard deposition of a membrane material, FIG. 4*e*.

A method in accordance with embodiments may be implemented to comprise arranging a second membrane structure in such a way that the electrode structure is arranged between the membrane structures $\mathbf{12}_1$ and $\mathbf{12}_2$ as shown in FIG. 3. Such a method may comprise manufacturing a reinforcement region of the second membrane structure $\mathbf{12}_2$ using a LOCOS process that may also be used to then insert material of a reinforcement structure 62. As an alternative or even in combination, an etching process that provides for edges of the obtained recess that are tapered or inclined with respect to a surface normal of the etched structure, may be used. According to an embodiment, different MEMS devices may be manufactured differently. For example, the MEMS device 20 may be manufactured using the LOCOS process or a described etching process. Although not precluding to use the LOCOS process for both membrane structures $\mathbf{12}_1$ and $\mathbf{12}_2$, a MEMS device having a double membrane structure such as MEMS device 30 may be manufactured by use of an etching process, e.g., at least for membrane structure $\mathbf{12}_2$ allowing a combination with the LOCOS process when using same for membrane structure $\mathbf{12}_1$ and/or allowing to use the etching process also for manufacturing the membrane structure $\mathbf{12}_1$. The reinforcement region 18 may be generated according to both options.

Embodiments provide, among other things, a membrane of a sensor that has a locally different thickness in order to achieve high robustness while maintaining sensitivity. Using the LOCOS process in the process flow for manufacturing a MEMS device such as a silicon microphone these different thicknesses can be achieved using standard CMOS (complementary metal oxide semiconductor) processes. Such a process flow may create a thickened structure with smooth transitions from the thicker to the thinner region and therefore may avoid high stress concentration at these points. This may be of relevance as for a membrane it may be at least to a certain extent or even mostly the thickness which determines together with the stress and the structure the sensitivity. Therefore, a thicker structure may be an aim to achieve robustness while a contradicting requirement may lead to a thin membrane to achieve high sensitivity. Embodiments allow to combine both aims while providing a solution.

Embodiments allow providing a reinforcement at regions where stress, e.g., due to an overload, and that is not equally present in all positions of the membrane, concentrates to avoid a failure of the device at those locations. A sensor membrane may be structured, according to an embodiment, in a way that it has locally a higher thickness to gain high robustness in the critical areas, where in the larger area of the membrane the thickness may be reduced or kept low to gain the wanted high sensitivity.

In accordance with a first aspect, a MEMS device comprises: a first membrane structure (12; $\mathbf{12}_1$), wherein the first membrane structure (12; $\mathbf{12}_1$) comprises a reinforcement region (18; $\mathbf{18}_1$-$\mathbf{18}_9$) formed from one piece of the first membrane structure (12; $\mathbf{12}_1$), wherein the reinforcement region (18; $\mathbf{18}_1$-$\mathbf{18}_9$) has a larger layer thickness ($\mathbf{22}_2$) than an adjoining region (24; $\mathbf{24}_1$-$\mathbf{24}_2$) of the first membrane structure (12; $\mathbf{12}_1$), and an electrode structure (28), wherein the electrode structure (28) is vertically spaced apart from the first membrane structure (12; $\mathbf{12}_1$).

In accordance with a second aspect, referring to the first aspect the reinforcement region (18; $\mathbf{18}_1$-$\mathbf{18}_9$) of the first membrane structure (12; $\mathbf{12}_1$) is arranged at a position of the membrane structure which is subjected to a locally increased mechanical stress during at least one of an operation condition of the MEMS device, an overload condition of the MEMS device; and a misuse condition of the MEMS device.

In accordance with a third aspect referring to the first and second aspect the reinforcement region (18; $\mathbf{18}_1$-$\mathbf{18}_9$) of the first membrane structure (12; $\mathbf{12}_1$) is arranged in a position aligned with respect to a bump ($\mathbf{42}_1$-$\mathbf{42}_3$) or elevation arranged at the electrode structure (28) or the first membrane structure (12; $\mathbf{12}_1$).

In accordance with a fourth aspect referring to the third aspect the bump ($\mathbf{42}_1$-$\mathbf{42}_3$) or elevation on the electrode structure (28) is oriented towards the first membrane structure (12; $\mathbf{12}_1$).

In accordance with a fifth aspect referring to any of the previous aspects the reinforcement region (18; $\mathbf{18}_1$-$\mathbf{18}_9$) of the first membrane structure (12; $\mathbf{12}_1$) is arranged to comprise a gradual or stepless transition of the layer thickness ($\mathbf{22}_2$) to the adjoining region (24; $\mathbf{24}_1$-$\mathbf{24}_2$) of the first membrane structure (12; $\mathbf{12}_1$).

In accordance with a sixth aspect referring to any of the previous aspects the first membrane structure (12; $\mathbf{12}_1$) comprises a deflectable region (46; $\mathbf{46}_1$) and a clamped border region, wherein the clamped border region adjoins the deflectable region (46; $\mathbf{46}_1$) along a borderline of the deflectable region (46; $\mathbf{46}_1$), wherein the reinforcement region (18; $\mathbf{18}_1$-$\mathbf{18}_9$) of the first membrane structure (12; $\mathbf{12}_1$) is arranged at the borderline.

In accordance with a seventh aspect referring to any of the previous aspects, the MEMS device further comprises: a second membrane structure ($\mathbf{12}_2$), wherein the electrode structure (28) is arranged between the first and second membrane structures ($\mathbf{12}_1$-$\mathbf{12}_2$), wherein the first and second membrane structures ($\mathbf{12}_1$-$\mathbf{12}_2$) each comprise a deflectable portion ($\mathbf{46}_1$-$\mathbf{46}_2$), and wherein the deflectable portions ($\mathbf{46}_1$-$\mathbf{46}_2$) of the first and second membrane structures ($\mathbf{12}_1$-$\mathbf{12}_2$) are mechanically coupled by means of at least one mechanical connection element ($\mathbf{54}_1$-$\mathbf{54}_3$) to each other and are mechanically decoupled from the electrode structure (28).

In accordance with an eighth aspect referring to the seventh the second membrane structure ($\mathbf{12}_2$) comprises a reinforcement region (18; $\mathbf{18}_1$-$\mathbf{18}_9$) formed from a single piece of the second membrane structure ($\mathbf{12}_2$), wherein the reinforcement region (18; $\mathbf{18}_1$-$\mathbf{18}_9$) of the second membrane structure ($\mathbf{12}_2$) has a larger layer thickness ($\mathbf{22}_2$) than an adjoining region (24; $\mathbf{24}_1$-$\mathbf{24}_2$) of the second membrane structure ($\mathbf{12}_2$), and wherein the reinforcement region (18; $\mathbf{18}_1$-$\mathbf{18}_9$) of the second membrane structure ($\mathbf{12}_2$) is arranged to comprise a gradual or stepless transition of the layer thickness ($\mathbf{22}_2$) to the adjoining region (24; $\mathbf{24}_1$-$\mathbf{24}_2$) of the second membrane structure ($\mathbf{12}_2$).

In accordance with a ninth aspect referring to the eighth aspect the reinforcement region (18; $\mathbf{18}_1$-$\mathbf{18}_9$) of the second membrane structure ($\mathbf{12}_2$) is arranged at a position of the second membrane structure ($\mathbf{12}_2$) which is subjected to a locally increased mechanical stress during at least one of an operation condition of the MEMS device, an overload condition of the MEMS device; and a misuse condition of the MEMS device.

In accordance with a tenth aspect referring to any of aspects 7 to 9, wherein at least one of the first and second membrane structure ($\mathbf{12}_1$-$\mathbf{12}_2$) comprises a reinforcement region (18; $\mathbf{18}_1$-$\mathbf{18}_9$) at a coupling position with the at least one mechanical connection element.

In accordance with an eleventh aspect referring to any of aspect 8 to 10, the reinforcement region of the second membrane structure ($\mathbf{12}_2$) is arranged in a position aligned with respect to a bump ($\mathbf{44}_4$-$\mathbf{44}_6$) or elevation arranged at the electrode structure (28) or the second membrane structure ($\mathbf{12}_2$).

In accordance with a twelfth aspect referring to the eleventh aspect, the bump or elevation on the electrode structure (28) is oriented towards the second membrane structure ($\mathbf{12}_2$).

In accordance with a thirteenth aspect referring to any of aspects 8 to 12, the second membrane structure ($\mathbf{12}_2$) comprises a deflectable region ($46_2$) and a clamped border region ($48_2$), wherein the clamped border region ($48_2$) adjoins the deflectable region ($46_2$) along a borderline ($52_4$) of the deflectable region ($46_2$), wherein the reinforcement region (18; $18_1$-$18_9$) of the second membrane structure ($12_2$) is arranged at the borderline ($52_4$).

In accordance with a fourteenth aspect a method for manufacturing the MEMS device according to any of the preceding aspects, comprises: manufacturing the reinforcement region (18; $18_1$-$18_9$) of the first membrane structure (12; $12_1$) using a LOCOS process (LOCOS=Local-Oxidation-of-Silicon) or using an etch process with tapered edges, and arranging the electrode structure (28) vertically spaced apart from the first membrane structure (12; $12_1$).

In accordance with a fifteenth aspect referring to the fourteenth aspect the method further comprises: arranging a second membrane structure ($12_2$) in such a way that the electrode structure (28) is arranged between the first and second membrane structures ($12_1$-$12_2$), and manufacturing a reinforcement region of the second membrane structure ($12_2$) using a LOCOS process (LOCOS=Local-Oxidation-of-Silicon).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present disclosure. It is understood that modifications and variations of the arrangements and the details described herein will be apparent to others skilled in the aft. It is the intent, therefore, to be limited only by the scope of the impending patent claims and not by the specific details presented by way of description and explanation of the embodiments herein.

What is claimed is:

1. A MEMS device comprising:

a first membrane structure comprising a deflectable region and a clamped border region, wherein the clamped border region adjoins the deflectable region along a borderline of the deflectable region, wherein the first membrane structure further comprises a first reinforcement region and an abutting adjoining region, the first reinforcement region arranged directly at the borderline so that the first reinforcement region overlaps the borderline, and wherein the first reinforcement region has a layer thickness larger than a layer thickness of the abutting adjoining region; and an electrode structure vertically spaced apart from the first membrane structure.

2. The MEMS device according to claim 1, wherein the first membrane structure comprises a second reinforcement region, wherein the second reinforcement region is located at a position aligned with respect to a bump or elevation at the electrode structure.

3. The MEMS device according to claim 2, wherein the bump or elevation on the electrode structure is oriented towards the first membrane structure.

4. The MEMS device according to claim 1, wherein the first and second reinforcement regions comprise a gradual or stepless transition of the layer thickness to the abutting adjoining region.

5. The MEMS device according to claim 1, wherein the first membrane structure is at least locally electrically conductive to allow application of an electrical potential between the first membrane structure and the electrode structure.

6. A MEMS device comprising:

a first membrane structure comprising a first deflectable region and a clamped border region, wherein the clamped border region adjoins the first deflectable region along a borderline of the first deflectable region, wherein the first membrane structure further comprises a plurality of first reinforcement regions and abutting adjoining regions, wherein a first reinforcement region of the plurality of first reinforcement regions is arranged directly at the borderline and overlaps the borderline, and wherein the first reinforcement region has a layer thickness larger than a layer thickness of the abutting adjoining region;

a second membrane structure comprising a second deflectable region; and an electrode structure vertically spaced apart from the first and second membrane structures, wherein the electrode structure is arranged between the first and second membrane structures, wherein the first and second deflectable regions are mechanically coupled to each other by at least one mechanical connection element and are mechanically decoupled from the electrode structure, and wherein at least one of the plurality of first reinforcement regions is located at a coupling position with the at least one mechanical connection element.

7. The MEMS device according to claim 6, wherein some of the plurality of first reinforcement regions are arranged at positions aligned with respect to bumps or elevations arranged at the electrode structure.

8. The MEMS device according to claim 7, wherein the bumps or elevations are oriented towards the first membrane structure.

9. The MEMS device according to claim 6, wherein the plurality of first reinforcement regions comprises a gradual or stepless transition of the layer thickness of the first reinforcement regions to the abutting adjoining regions.

10. The MEMS device according to claim 6, wherein the second membrane structure comprises a plurality of second reinforcement regions that has a layer thickness larger than a layer thickness of the abutting adjoining regions of the second membrane structure, and wherein the plurality of second reinforcement regions comprises a gradual or stepless transition of the layer thickness of the plurality of second reinforcement regions to the thickness of the abutting adjoining regions.

11. The MEMS device according to claim 10, wherein the second membrane structure comprises a deflectable region and a clamped border region, wherein the clamped border region adjoins the deflectable region along a borderline of the deflectable region of the second membrane structure, and wherein at least one second reinforcement region of the plurality of second reinforcement regions is arranged directly at the borderline.

12. The MEMS device according to claim 11, wherein the plurality of second reinforcement regions is arranged in positions aligned with respect to bumps or elevations arranged at the electrode structure.

13. The MEMS device according to claim 12, wherein the bumps or elevations on the electrode structure are oriented towards the second membrane structure.

14. The MEMS device according to claim 6, wherein the at least one of the plurality of first reinforcement regions comprises a material having a higher stiffness than a material of the first membrane structure.

15. A MEMS device comprising:

a first membrane structure comprising a first deflectable region and a clamped border region, wherein the clamped border region adjoins the first deflectable region along a borderline of the first deflectable region, wherein the first membrane structure further comprises a plurality of first reinforcement regions abutting adjoining regions, wherein each first reinforcement region of the plurality of first reinforcement regions has a layer thickness larger than a layer thickness of the abutting adjoining region;

a second membrane structure comprising a second deflectable region; and an electrode structure vertically spaced apart from the first and second membrane structures, wherein the electrode structure is arranged between the first and second membrane structures, wherein the first and second deflectable regions are mechanically coupled to each other by at least one mechanical connection element and are mechanically decoupled from the electrode structure, and wherein at least one of the plurality of first reinforcement regions is located at a coupling position with the at least one mechanical connection element, wherein the at least one of the plurality of first reinforcement regions is directly under the at least one mechanical connection element in a cross-sectional view.

16. The MEMS device according to claim 15, wherein some of the plurality of first reinforcement regions are arranged at positions aligned with respect to bumps or elevations arranged at the electrode structure.

17. The MEMS device according to claim 16, wherein the bumps or elevations are oriented towards the first membrane structure.

18. The MEMS device according to claim 15, wherein the plurality of first reinforcement regions comprises a gradual or stepless transition of the layer thickness of the first reinforcement regions to the abutting adjoining regions.

19. The MEMS device according to claim 15, wherein the first and second deflectable regions are mechanically coupled to each other by a plurality of mechanical connection elements and are mechanically decoupled from the electrode structure, and wherein some of the plurality of first reinforcement regions are located at coupling positions with the plurality of mechanical connection elements.

20. The MEMS device according to claim 19, wherein each mechanical connection element has a respective first reinforcement region located at a respective coupling position.

* * * * *